(12) United States Patent
Benda et al.

(10) Patent No.: US 12,431,322 B2
(45) Date of Patent: Sep. 30, 2025

(54) SYSTEM AND METHOD FOR HANDLING SAMPLES FOR STUDY IN A CHARGED PARTICLE APPARATUS, SUCH AS A TRANSMISSION ELECTRON MICROSCOPE

(71) Applicant: FEI Company, Hillsboro, OR (US)

(72) Inventors: Jiří Benda, Brno (CZ); Vojtěch Doležal, Brno (CZ); Tomáš Trnkócy, Brno (CZ); Jaroslav Hadzima, Trnava (SK); Martin Čechmánek, Rovečné (CZ); Ondřej Sháněl, Brno (CZ)

(73) Assignee: FEI Company, Hillsboro, OR (US)

( * ) Notice: Subject to any disclaimer, the term of this patent is extended or adjusted under 35 U.S.C. 154(b) by 386 days.

(21) Appl. No.: 18/124,465

(22) Filed: Mar. 21, 2023

(65) Prior Publication Data

US 2023/0298849 A1 Sep. 21, 2023

(30) Foreign Application Priority Data

Mar. 21, 2022 (EP) ..................................... 22163221

(51) Int. Cl.
*H01J 37/20* (2006.01)
(52) U.S. Cl.
CPC ....... *H01J 37/20* (2013.01); *H01J 2237/2007* (2013.01)
(58) Field of Classification Search
CPC .......................... H01J 37/20; H01J 2237/2007
See application file for complete search history.

(56) References Cited

U.S. PATENT DOCUMENTS

| 4,764,076 | A | 8/1988 | Layman et al. |
| 10,217,603 | B2 | 2/2019 | Liht et al. |
| 2001/0026747 | A1 | 10/2001 | Saga |
| 2016/0181135 | A1 | 6/2016 | Buonodono |
| 2017/0370814 | A1 | 12/2017 | Gaechter |
| 2021/0109450 | A1* | 4/2021 | Vukovic ........... H01L 21/67069 |
| 2021/0313139 | A1 | 10/2021 | Maler et al. |

FOREIGN PATENT DOCUMENTS

JP 2004 273603 A 9/2004

* cited by examiner

*Primary Examiner* — Sean M Luck
(74) *Attorney, Agent, or Firm* — Leron Vandsburger

(57) ABSTRACT

The invention relates to a sample handling and storage system. The system is used for storing and handling samples, which may be cryogenic samples, that are arranged for use in charged particle microscopy, such as cryo-electron microscope samples for use in cryo-transmission electron microscopy. The system comprises a storage apparatus for storing a plurality of samples, and a Charged Particle Apparatus (CPA), such as a cryo-TEM, at a location remote from said storage apparatus. The system further comprises a transfer device that is releasably connectable to said storage apparatus, and that is releasably connectable to said CPA as well. As defined herein, said transfer device is arranged for acquiring a sample from said plurality of samples when connected to said storage apparatus, and arranged for transferring said sample from said transfer device to said CPA when connected to said CPA.

20 Claims, 10 Drawing Sheets

SYSTEM AND METHOD FOR HANDLING SAMPLES FOR STUDY IN A CHARGED PARTICLE APPARATUS, SUCH AS A TRANSMISSION ELECTRON MICROSCOPE

CROSS REFERENCE TO RELATED APPLICATIONS

This application claims priority to and the benefit of U.S. Provisional Application No. 63/222,525 (filed on Jul. 16, 2021), the disclosure of which is incorporated herein by reference in its entirety for any and all purposes.

TECHNICAL FIELD

The invention relates to a system and method for handling samples, comprising a storage apparatus, a transfer device and a Charged Particle Apparatus (CPA), such as a Charged Particle Microscope (CPM) in the form of a Transmission Electron Microscope (TEM).

BACKGROUND

Biology is the natural science that studies life and living organisms, including their physical structure, chemical processes, molecular interactions, physiological mechanisms, development and evolution.

Cell biology is a branch of biology that studies the structure and function of the cell, the basic unit of life. Cell biology is concerned with the physiological properties, metabolic processes, signalling pathways, life cycle, chemical composition and interactions of the cell with their environment. In cell biology, molecular recognition between macromolecules governs all of the most sophisticated processes in cells. The most common macromolecules comprise biopolymers (nucleic acids, proteins, carbohydrates and lipids) and large non-polymeric molecules (such as lipids and macrocycles).

Many researchers are interested in studying macromolecular complexes in their natural environment at high resolution in order to reveal their structural dynamics and interactions. To this end, charged particle microscopy may be used.

Charged particle microscopy is a well-known and increasingly important technique for imaging microscopic objects, particularly in the form of electron microscopy (EM). Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

In a SEM, irradiation of a sample by a scanning electron beam precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for sample analysis.

In TEM, a beam of electrons is transmitted through a specimen to form an image from the interaction of the electrons with the sample as the beam is transmitted through the specimen. The image is then magnified and focused onto an imaging device, such as a fluorescent screen, a layer of photographic film, or a sensor such as a scintillator attached to a charge-coupled device (CCD). The scintillator converts primary electrons in the microscope to photons so that the CCD is able to detect it.

EM provides a number of ways to study biological samples: conventional TEM is used to study gross morphology of biological samples; electron crystallography and single-particle analysis are dedicated to study proteins and macromolecular complexes; and (cryo-)electron tomography and Cryo-EM of vitreous sections (CEMOVIS) are aimed at cellular organelles and molecular architectures. In Cryo-EM and CEMOVIS, samples are preserved by rapid freezing using a vitrification technique, and observed by cryo-TEM. CEMOVIS additionally includes the cryo-sectioning of the sample, which may be done using a cryo-FIB technique.

Preparing a biological sample for study in an analysis device often is time consuming and labour intensive. Preparing a Cryo-EM specimen, for example, comprises the steps of taking an aqueous sample of a biological material (usually a purified protein complex), applying it to a support structure (grid), reducing its dimension to a layer that is as thin as possible (~100-800 Å, depending on the size of the biological molecule), and then freezing this layer fast enough to prevent the water from crystallising. Many aspects of this process of preparing a biological sample are problematic.

Once the Cryo-EM sample is prepared it needs to be stored and handled at appropriate conditions for later use in a Charged Particle Microscope. To this end, a plurality of cryo-EM samples may be stored in individual grid boxes. These grid boxes can be placed in conical falcon tubes that are then stored into long-term liquid nitrogen storage dewars.

Once required, the falcon tube is taken out of the dewar, and the correct grid box corresponding to the desired sample is retrieved from the falcon tube.

Different methods can be applied for putting the desired sample into the Cryo-Electron Microscope.

In a first embodiment, a cryo-transfer holder may be used. This is a liquid nitrogen holder that is designed for the frost-free transfer of a sample at liquid nitrogen temperature into a transmission electron microscope (TEM). The sample is taken out of the grid box and manually placed inside the cryo-transfer holder. Then the cryo-transfer holder may be connected to the TEM. The cryo-transfer holder holds the sample in place inside the TEM during the acquisition. The placement of the cryo-transfer holder inside the TEM has proven to be troublesome, as the failure rate of cryo-holder insertion into the microscope is relatively high. During a 20-minute period after connecting the cryo-transfer holder, there is a significant amount of sample drift taking place. Furthermore, the cryo-transfer holder limits the throughput of samples in the TEM, as the cryo-transfer holder needs to be manually refilled with liquid nitrogen every 12 hours, and there is a 4-hour long cryo-cycle of the microscope that is required after 4-5 insertions.

In a second embodiment, the sample is loaded into the TEM using a cryogenic sample manipulation robot. Such a sample manipulation robot is known, from example, as the product AutoLoader sold by Thermo Scientific™. The AutoLoader is a module that is installed as part of the TEM. Samples are manually placed inside AutoLoader Cartridges. These AutoLoader Cartridges are then stored in cryogenic storages, such as a dewar. Once required, the Cartridges are retrieved from the dewar and placed inside the AutoLoader Module. The desired sample is then taken out of the cartridge by the manipulation robot, which transfers the sample to the sample holder inside the TEM. Then the sample can be imaged using the TEM. Although this known system provides excellent results, especially in terms of sample transfer quality and screening throughput, there is still room for improvements on other levels, such as, for example, improved sample loading into cartridges, complexity, ease of installation and maintenance, and associated costs.

One or more of these embodiments may require the user to perform the steps of latching the cryo-transfer holder and/or the Cartridge, or perform other tasks, including connecting of cables, opening and/or closing of transition chambers, opening and/or closing of valves, and/or insertion of the sample.

From the above it thus follows that there is a desire for an improved sample storage and handing system that provides improved security and an improved user experience for storing cryogenic samples, transferring cryogenic samples, and studying cryogenic samples in a charged particle microscope or similar apparatus.

In general, there is a desire for an improved sample storage and handing system that provides an improved user experience for storing samples, transferring samples, and using these samples in a charged particle apparatus, such as a charged particle microscope. Thus, the present disclosure is not limited to cryo-EM samples, but can also be used for non-cryo-EM samples.

With the above in mind, the disclosure provides a sample handling and storage system.

The sample handling and storage system comprises a storage apparatus for storing a plurality of samples. The storage apparatus is arranged for storing the samples, which may be Cryo-EM samples. The storage apparatus may be arranged for storing the samples under cryogenic conditions.

The sample handling and storage system further comprises a Charged Particle Apparatus (CPA) at a location remote from said storage apparatus. The distance between the CPA and the storage apparatus is such that a direct transfer of a sample between the storage apparatus and the CPA is hard or virtually impossible. Thus, the system further comprises a transfer device that is arranged to be movable between the storage apparatus and the CPA.

The transfer device is releasably connectable to said storage apparatus and said CPA. By this it is meant that the transfer device can be connected and disconnected to the storage apparatus. The transfer device is furthermore releasably connectable to said CPA, and thus the transfer device may be connected and disconnected to said CPA. In a disconnected state of the transfer device, the transfer device is movable between the storage apparatus and the CPA, in particular by means of a human operator that carries the transfer device from and to the storage apparatus and the CPA, respectively, or vice versa. In a connected state of the transfer device, sample transfer between the transfer device and the apparatus it is connected to is possible. Thus, the system is arranged for transferring a sample from said storage apparatus to said transferring device when said transfer device is connected to said storage apparatus, and arranged for transferring said sample from said transfer device to said CPA when connected to said CPA. A transfer back from the CPA, by means of the transfer device, to the storage apparatus, is conceivable as well. In other words, the transfer device is arranged for acquiring a sample at the CPA, and for transferring said sample from said transfer device to said storage apparatus. This increases the versatility of the storage and handling system as defined herein.

With this, it becomes possible to connect a single transfer device to a storage apparatus and acquire a sample, and transport the transfer device with the sample to the CPA, such as a TEM, for loading the sample into the CPA. The transfer from said transfer device to said CPA may include a transfer to a sample holder (i.e. sample stage) that is part of the CPA. The transport from the storage apparatus to the CPA may be done manually, i.e. by a human operator carrying the transfer device from the storage apparatus to the CPA.

As defined herein, the sample handling and storage system comprises at least one suction disc mechanism for securing said connection between said transfer device and at least one of said storage apparatus and said CPA.

By using a suction disc mechanism a secure connection between the transfer device and the at least one of said storage apparatus and said CPA can be established. This allows the transfer device to be easily and quickly connected to the storage apparatus and/or the CPA. The connection is reliable and reproducible and allows safe transfer of the sample from and to the various apparatuses to be established. With this, the object as defined herein is achieved.

As indicated before, the transfer device can be connected to the storage apparatus and the Charged Particle Apparatus. For reasons of conciseness, it will be referred to the "desired apparatus". Thus, the transfer device is connectable to a desired apparatus, which includes the storage apparatus and/or the CPA.

The suction disc mechanism may comprise at least a first sealing ring. In a connected state of the transfer device to the desired apparatus, the first sealing ring will be in contact with the transfer device and the desired apparatus. The first sealing ring, at least a part of the transfer device, and at least part of the desired apparatus (i.e. storage apparatus or CPA) will define a suction disc volume. By lowering the pressure in this suction disc volume, the resulting reduced pressure will ensure that the connection between the transfer device and the desired apparatus is more secure. Lowering the pressure in the suction disc volume can be obtained in a plurality of ways, including lowering the pressure by means of a pumping element, and including enlarging the volume of the suction disc volume whilst keeping the enclosure airtight. Enlarging the volume can be done by using a flexible or movable wall element, for example.

Advantageous embodiments will be discussed below.

In an embodiment, the transfer device comprises an elongated housing. The storage apparatus may comprise a receiving recess that is adapted to receive at least part of the elongated housing of the transfer device. Similarly, the CPA may comprise a corresponding receiving recess for receiving at least part of said elongated housing of the transfer device. The receiving recess of the CPA may largely correspond to the receiving recess of the storage apparatus, although differences may be present, of course. By using an elongated housing and corresponding recess, initial connection of the transfer device to the CPA and/or storage apparatus may be quick and easy. Once the elongated transfer device is inserted into the recess, the suction disc mechanism can be activated to secure the connection so that sample transfer may take place.

In an embodiment, side walls of the receiving recess provide a guiding surface for said housing of said transfer device. Additionally, the recess may comprise a bottom wall that provides for an abutting surface for said housing. By inserting the elongated housing of the transfer device into the receiving recess, and continuing the inserting movement until a top face of the transfer device reaches the bottom wall of the recess, it is ensured that the transfer device is connected to the corresponding apparatus in a predictable manner, in particular having a reproducible position thereof.

In an embodiment, the elongated housing comprises a connection face that, in a connected state, is directed to said bottom wall of said recess, and is at least partly in contact with said bottom wall.

It may be advantageous to provide the suction disc mechanism on said transfer device. In other embodiments, the suction disc mechanism can be provided on the storage apparatus and the CPA. In further embodiments, the storage apparatus, the CPA and the transfer device each have a respective suction disc mechanism. In view of costs and connectability, however, it may be advantageous to only provide the transfer device with the suction disc mechanism. In that case, it is preferred, in an embodiment, that said suction disc mechanism is provided on said connection face of said transfer device, so that it may be brought into contact with said bottom wall of said recess to temporarily establish a fixed connection.

In an embodiment, said transfer device comprises a transfer port provided in said connection face, and said bottom wall of said recess comprises a transfer opening. The transfer device may comprise a transfer storage room that is provided within said elongated housing. The transfer port may be used to gain access to said transfer storage room. The transfer storage room may be arranged for maintaining a sample at a desired environment. In case a cryo-EM sample is used, for example, it is conceivable that the transfer storage room is arranged for keeping said cryo-EM at or near cryogenic conditions. This may include active and/or passive cooling elements.

In an embodiment, said suction disc mechanism encloses said transfer port, in a connected state of the transfer device to the desired apparatus. To this end, the suction disc mechanism may include a first sealing ring and a second sealing ring. The second sealing ring comprises smaller dimensions compared to the first sealing ring. The first sealing ring is provided in such a way that it completely surrounds said second sealing ring. Said first sealing ring and said second sealing ring, together with the transfer device and the desired apparatus define the suction disc volume. The first sealing ring thus defines an outermost contour of the suction disc volume, and the second sealing ring thus defines an innermost contour of the suction disc volume. The second sealing ring encloses said transfer port.

It is noted that in the above embodiments, the suction disc mechanism can be provided on the transfer device. It is also conceivable that the suction disc mechanism is provided on the desired apparatus. In the embodiment that uses two sealing rings, the sealing rings can be provided on the desired apparatus so that in a connected state of the transfer device to the desired apparatus the second sealing ring encloses the transfer port of the transfer device.

In an embodiment, said transfer device and at least one of said storage apparatus and said CPA are provided with electrical contact elements. The electrical contact elements may be provided on the transfer device and the desired apparatus. The electrical contact elements are arranged to be in contact with each other in a connected state of said transfer device to said at least one of said storage apparatus and said CPA. The electrical contact elements can be provided on the elongated housing of the transfer device, and on the recess of the desired apparatus.

As indicated before, the elongated housing may comprise a connection face that, in a connected state, is directed to a bottom wall of said recess. The suction disc mechanism may be arranged to act on the bottom wall of the recess and the connection face. In particular, the suction disc mechanism can be provided on the connection face of the transfer device. Additionally, it is conceivable that also the electrical contact elements are provided on the connection face and the bottom wall.

In an embodiment, the transfer device comprises a transfer mechanism that is arranged for acquiring said sample from said storage apparatus when connected to said storage apparatus, and for delivering said sample to said CPA when connected to said CPA. The transfer mechanism can be arranged within the elongated housing, and may be arranged for storing said sample within said transfer storage room. The transfer mechanism can be arranged for moving said sample from said transfer storage room, through said transfer port, to said desired apparatus. The transfer mechanism ensures a safe and reliable transfer between the apparatuses of the system, and the transfer device. No manual labour or manual sample handling is required for transferring a sample from the storage apparatus to the transfer device. Additionally, no manual labour or manual sample handling is required for transferring the sample from the transfer device to the CPA.

The transfer mechanism may comprise a gripper, for example. The gripper may be arranged for gripping a sample.

The samples used in the system may comprise EM grids. These grids are known per se to those skilled in the art, and may comprise a small (several millimeters) copper disc that comprises a fine mesh with a carbon foil on top. The grid may be composed of other materials as well. The sample may be a material science sample that is applied to the sample grid. The samples may be stored in the storage apparatus. A human operator may manually load the samples into the storage apparatus. In an embodiment, that is the only direct human sample manipulation that is required to be used in the system.

Manually loading the samples into the storage apparatus may comprise the step of manually loading individual samples into a sample cassette. The storage apparatus may comprise at least one cassette for storing at least a part of said plurality of samples. The human operator places the desired samples into such a cassette, and then the cassette can be placed inside the storage apparatus. Naturally, the transfer device is arranged for acquiring a sample out of said cassette, in that case.

The storage apparatus may be part of a first working station. The first working station comprises a human operator desk, where the human operator is able to sit or stand. The human operator may manually store or remove a plurality of samples in the storage apparatus. The human operator may additionally, or alternatively, connect the transfer device to the storage apparatus. The transfer device may be docked to a part of the first working station, to that end.

In an embodiment, said storage device and said CPA each comprise a first docking member, and said transfer device comprises a further (second) docking member that is arranged to mate with said first docking member. The first docking member may comprise the recess as described herein. The second docking member may comprise (part of) the elongated housing as described herein. At least one of the first and second docking member may comprise a part of the suction disc mechanism, and preferably said second docking member comprises the suction disc mechanism. The first and second docking member may comprise the electrical contact elements. The use of first and second docking member ensures that it is relatively easy to establish a connection between the transfer device and the storage device, disconnect the transfer device from the storage device, and move the transfer device to the CPA where the transfer device is subsequently connected to the CPA for transferring the sample from the transferring device to the CPA. In particular, the suction disc mechanism allows for easy connection and release during the transfer of the sample from the storage apparatus to the CPA, and vice versa.

In an embodiment, each of said first docking members comprises a first valve, wherein said first valves are arranged to be closed in a dismounted condition, and wherein said valves are arranged to be openable in a docked state. and The second docking member may comprises said transfer port. The transfer port may be openable in a docked state, and may be closed in a dismounted state. This way, the preferred sample conditions (such as temperature, humidity, and pressure, for example) can be maintained inside the storage apparatus, the transfer device, and the CPA. The transfer device can be connected to the storage apparatus by means of the docking members, and the valves and/or transfer port may be opened such that the transfer room of said transfer device is fluidly connected to a storage room of said storage apparatus. The fluid connection between the storage apparatus and the transfer device then allows sample transfer to take place.

Said storage apparatus may comprise an operator input device and a control unit. The input device may be part of the first working station, in said embodiment. The operator input device may be arranged for selecting, by a human operator, a cryogenic sample to be transferred. Said control unit is arranged for controlling said storage apparatus and said transfer device for transferring said selected cryogenic sample from said storage apparatus to said transfer device, in particular in an automated way. This improves the reliability of the system, as it allows correct labelling of samples and subsequent handling thereof.

According to an aspect, a transfer device for transferring a sample for use in a sample handling and storage system as defined herein is provided. The transfer device is releasably connectable to a storage apparatus for storing a plurality of samples, wherein in a connected state of said transfer device to said storage apparatus a sample is transferrable from said storage apparatus to said transfer derive. The transfer device is furthermore releasably connectable to a Charged Particle Apparatus (CPA), wherein in a connected state of said transfer device to said CPA said sample is transferrable to said CPA. As defined herein, said transfer device comprises at least one suction disc mechanism for securing said connection between said transfer device and said sample handling and storage system and said CPA. The suction disc mechanism may be embodied as previously described herein in relation to the suction disc mechanism being part of the transfer device.

In an embodiment, the transfer device comprises an elongated housing having at least one connection face. The suction disc mechanism may be provided on said transfer device, in particular on said connection face.

The transfer device may comprise a transfer port provided in said connection face.

In an embodiment, the suction disc mechanism encloses said transfer port.

According to an aspect, the disclosure relates to a sample handling and storage system that is arranged for storing and handling samples for use in a Charged Particle apparatus, wherein said samples are being handled under cryogenic conditions. An example of this is cryogenic electron microscopy (cryo-EM), which is a cryomicroscopy technique applied on samples cooled to cryogenic temperatures and embedded in an environment of vitreous water. These types of samples are often referred to as Cryo-EM samples, but typically these samples can be used with other Charged Particle apparatuses as well. Hereinafter, this type of sample will be referred to as Cryogenic Sample (CS).

Thus, in an embodiment, the disclosure may relate to a Cryogenic Sample handling and storage system. The handling and storage system may be arranged for handling and storing Cryo-EM samples.

The Cryogenic Sample storage and handling system as defined herein, allows a quick and easy collection of a sample that is stored under cryogenic conditions, to a charged particle apparatus, such as a TEM, for being studied. Sample collection (i.e. acquisition from the storage apparatus), and sample drop-off (i.e. transfer to the CPA) can be done semi-automatically, i.e. without any human operator actually handling the sample. The transport from the storage apparatus to the CPA may be done manually, i.e. by a human operator carrying the transfer device from the storage apparatus to the CPA.

This embodiment provides an improved Cryogenic Sample storage and handling system, with which cryo-EM samples, or the like, can be easily and safely stored, be transferred to a charged particle apparatus, such as a Cryo-TEM, and be returned to the storage apparatus where the sample can be stored under cryogenic conditions. Thus an improved Cryogenic Sample storage and handling system is obtained.

In an embodiment, said Cryogenic Sample storage apparatus comprises a cryogenic storage room. The storage room may be fluidly connected to said transfer device, in particular a transfer room thereof. The storage room may be directly connected to said transfer room, in a connected state of the transfer device. An intermediate room may be provided as well. In that case, sample transfer may be done from the storage room to the intermediate room, and then transfer may be done from the intermediate room to the transfer room of the transfer device. The storage apparatus may comprise a transfer mechanism too. The storage apparatus transfer mechanism may be arranged for cooperating with said transfer mechanism of said transfer device, so that effective sample transfer between the storage apparatus and the transfer device may take place.

It is noted that the general system as described herein may comprise at least one further CPA. The transfer device may in that case be arranged to be releasably connectable to said further CPA, and thus the transfer device may be connected and disconnected to said further CPA as well. In a disconnected state of the transfer device, the transfer device is movable between the storage apparatus, the CPA and the at least one further CPA. In a connected state of the transfer device, sample transfer between the transfer device and the apparatus it is connected to, such as the further CPA, is possible. The transfer device may thus be arranged for transferring said sample from said transfer device to said further CPA when connected to said further CPA. Thus, a single transfer device can be used in a system where a plurality of CPAs are present. This central approach to the storage and handling system ensures that each of the plurality of CPAs do not require a specific dedicated transfer mechanism, such as would be the case when each of the CPAs were to be equipped with an AutoLoader module, for example. This way, the system may be constructively simple and therefore relatively cheap.

The system, apparatuses and device as described herein allow a method for transferring a sample to be performed. The method comprises the steps of providing a sample handling and storage system as defined herein. The method may further comprise the steps of:

Storing at least one sample in said storage apparatus;
Connecting said transfer device to said storage apparatus;
Transferring said sample from said storage apparatus to said transfer device;
Dismounting said transfer device from said storage apparatus;
Moving said transfer device to said Charged Particle Apparatus (CPA), wherein said CPA is located remotely from said storage apparatus;
Connecting said transfer device to said CPA; and
Transferring said sample from said transfer device to said CPA.

The steps of transferring the sample from a desired apparatus to the transfer device, and vice versa, may be done mechanically. A mechanical transfer mechanism may be used for establishing the transfer.

The steps of transferring the sample may be done automatically. By automatically, it is implied that no manual sample handling and/or manipulation is required from a human operator. It is conceivable, however, that the human operator initiates the sample transfer, for example by using a button, dial, knob, or the like, or by inputting a corresponding command into a User Interface, such as a Graphical User Interface (GUI).

The steps of connecting and/or dismounting may be done by means of a human operator that physically connects the transfer device to the storage apparatus, or the CPA. Some parts of the connecting and/or dismounting may require the use of docking mechanisms, such as, in an embodiment, opening and closing of valves.

The steps of moving the transfer device may be done by means of a human operator that physically moves the transfer device from and to the storage apparatus and/or the CPA.

The method and system as defined herein allow safe and effective sample transfer, wherein a human operator is used for transferring the sample between relevant apparatuses, and a more dedicated transfer mechanism allows safe and reliable transfer from the transfer device to the apparatuses. With this, the object as defined herein is achieved.

BRIEF DESCRIPTION OF DRAWINGS

The invention will now be elucidated in more detail on the basis of exemplary embodiments and the accompanying schematic drawings, in which.

DETAILED DESCRIPTION OF DRAWINGS

Figure 1:
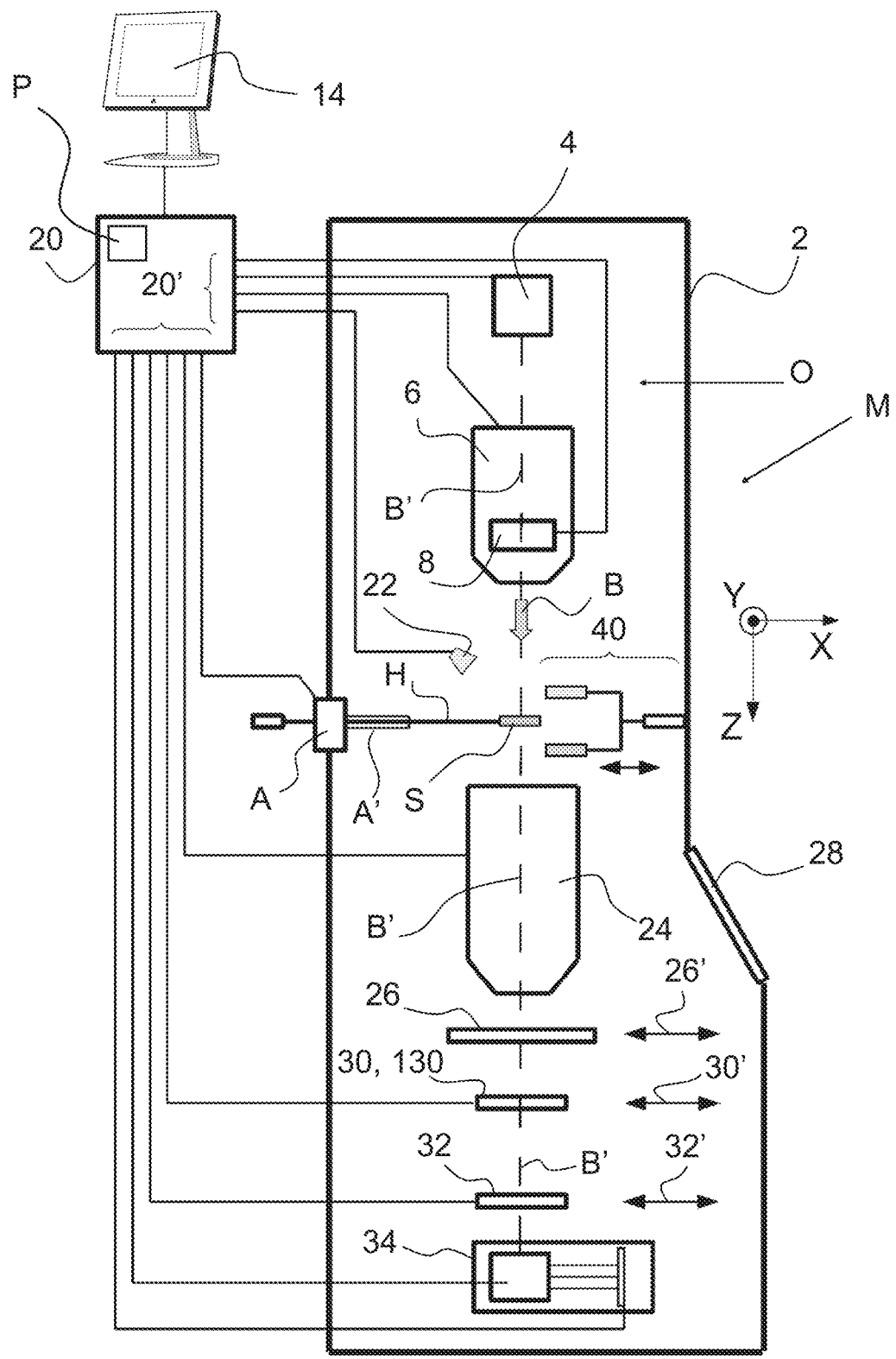
FIG. 1—shows a longitudinal cross-sectional view of a charged particle microscope according to a first embodiment of the invention.

FIG. 1 (not to scale) is a highly schematic depiction of an embodiment of a charged-particle microscope M. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30, although camera 32 can be an Electron Microscope Pixel Array Detector (EMPAD) as well. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired. The controller comprises, as shown in this embodiment, a data processing apparatus P that is arranged for carrying out the method as defined herein.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Figure 2:
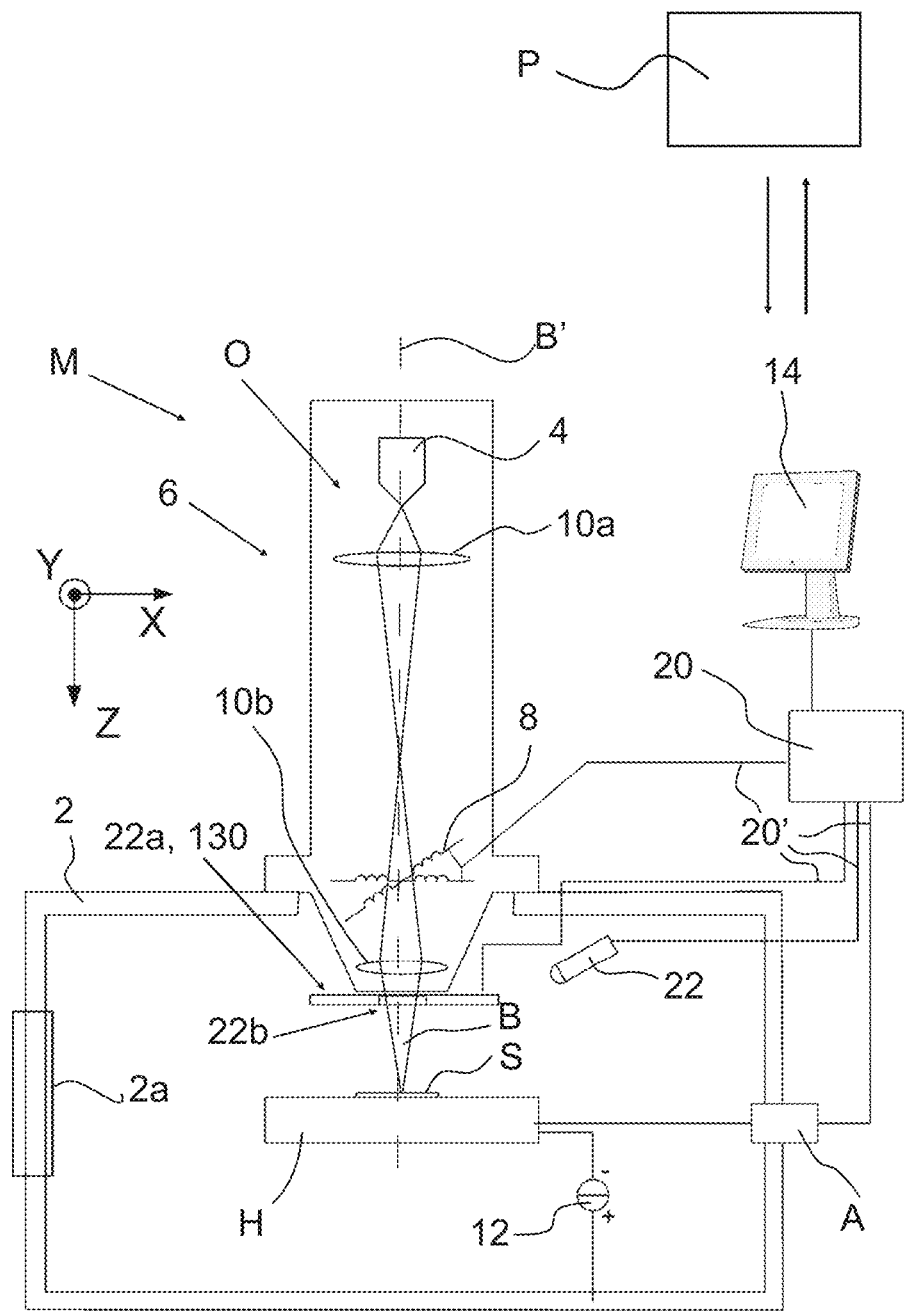
FIG. 2—shows a longitudinal cross-sectional view of a charged particle microscope according to a second embodiment of the invention.

Now referring to FIG. 2, another embodiment of a charged particle apparatus is shown. FIG. 2 (not to scale) is a highly schematic depiction of a charged-particle microscope M; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;

10a, 10b: Schematically depicted lenses/optical elements in illuminator 6;

12: A voltage source, allowing the specimen holder H, or at least the specimen S, to be biased (floated) to an electrical potential with respect to ground, if desired;

14: A display, such as a FPD or CRT;

22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Here also, a controller 20 is present. The controller is connected to the display 14, and the display 14 may be connectable to a data processing apparatus P that is arranged for carrying out the method as defined herein. In the embodiment shown, the data processing apparatus P is a separate structure that does not form part of the controller, and does not even form part of the microscope P. The data processing apparatus P may be local or cloud based, and is in principle not limited to any location.

The charged particle apparatuses shown in FIGS. 1 and 2, and Electron Microscope (EM) in particular, offer a number of ways to study biological samples: conventional TEM is used to study gross morphology of biological samples; electron crystallography and single-particle analysis are dedicated to study proteins and macromolecular complexes; and (cryo-)electron tomography and Cryo-EM of vitreous sections (CEMOVIS) are aimed at cellular organelles and molecular architectures.

As indicated in the introduction, these biological samples can be preserved by rapid freezing using a vitrification technique, to be subsequently studied using a cryo-EM technique, such as cryo-TEM. Cryo-sectioning of the sample, using a cryo-FIB technique, may be part of sample study.

Samples used in these studies, must first be prepared, and are then stored. To this end, an aqueous sample of a biological material (usually a purified protein complex) is taken and applied to a support structure (grid), the dimension is reduced to a very thin layer, and then this layer is frozen fast enough to prevent the water from crystallising. Samples are then prepared and stored for further handling.

Figure 3:
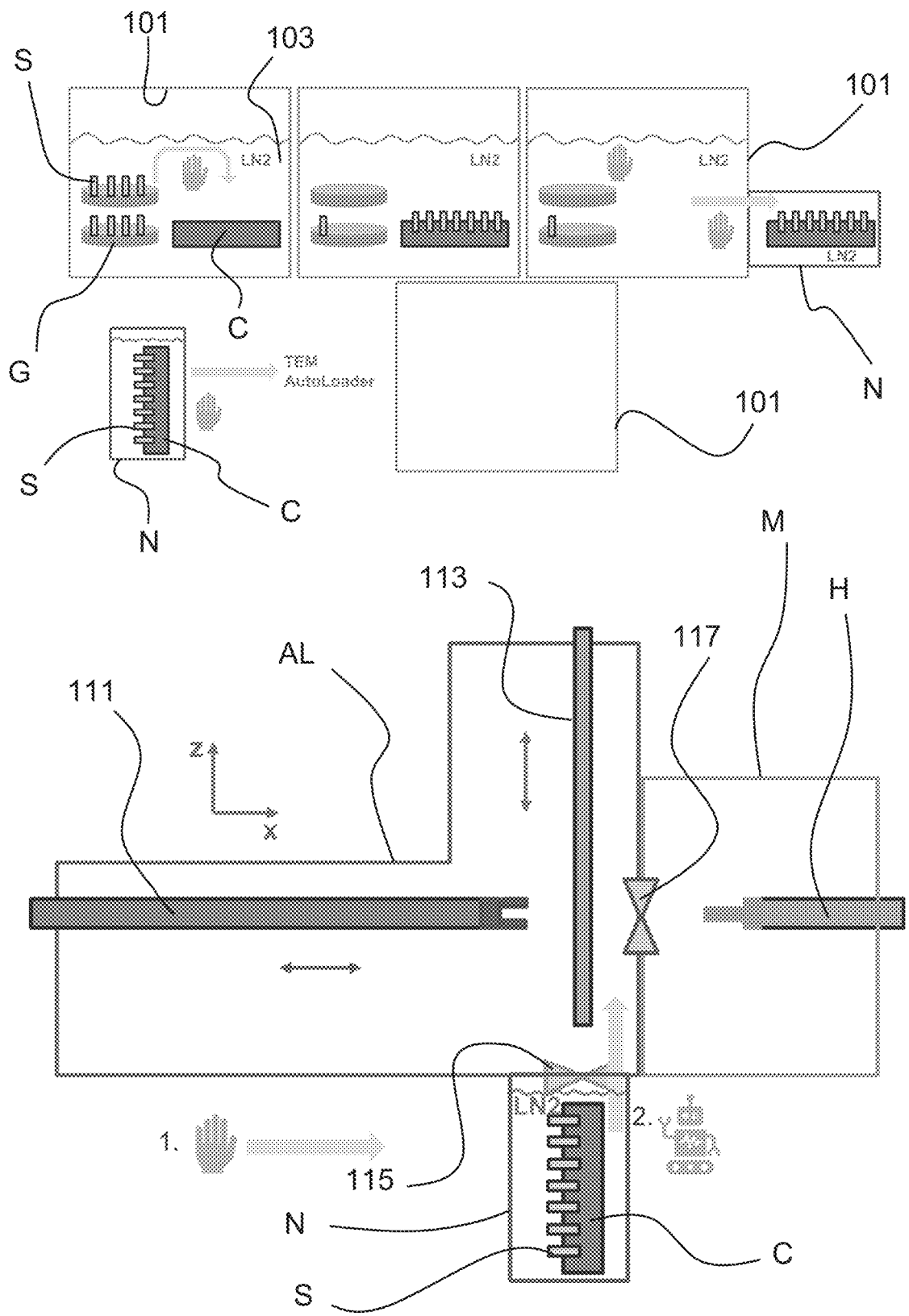
FIG. 3—shows a prior art sample handling and storage method.

As indicated in the introduction, one of the methods for storing and handling samples relates to a so-called AutoLoader. Now referring to FIG. 3, an embodiment of this prior art technique is discussed. FIG. 3 shows a workflow of collecting samples S for transport to a charged particle microscope M, such as a cryo-TEM, using an AutoLoader AL and associated NanoCab N cartridge. The AutoLoader AL is part of the microscope M. The NanoCab is loaded with a plurality of samples S, and then transported to the AutoLoader AL for loading a sample into the TEM.

Shown in FIG. 3, top row, from left-to-right, is the preparation of the NanoCab N. A plurality of samples S (i.e. a biological specimen that is provided on a grid) are provided in gridboxes G. The gridboxes G with the samples S are put into a loading station 101. The loading station 101 is filled with liquid nitrogen 103, keeping the samples S and the gridboxes G at a desired, low, temperature. A cassette C is also provided in the liquid nitrogen 103. The samples S are manually transferred from the gridboxes G to the cassette C. Once the cassette is full, the Nanocab device N is connected to the loading station 101, and the cassette is provided inside the Nanocab N. The Nanocab N device now contains the cassette C with desired samples S, wherein the Nanocab N device is filled with liquid nitrogen for keeping the samples S at the desired, low, temperature. The loading station 101 can then go back to room temperature, as the liquid nitrogen is removed from the loading station when, or after, the cassette C is introduced into the Nanocab device N.

FIG. 3, bottom part, shows that the Nanocab N, comprising the cassette C with a plurality of samples S, is connected to an Autoloader AL module. The Autoloader AL module is connected to a microscope, or is part thereof.

The Autoloader AL module comprises a cassette arm 113, and a sample arm 111. The inside of the Autoloader AL housing is kept at a desired, low, temperature that is arranged for preserving cryo-Samples. The Autoloader AL module comprises two valve elements 115, 117. The first one 115 is able to provide a connection to a connected Nanocab N. The second one 117 is able to provide a connection to the microscope M.

The procedure for loading the samples from the Nanocab N to the microscope M is as follows. The Nanocab N is connected to the Autoloader AL, as shown in FIG. 3, lower part. The valve 115 is opened, and the cassette arm 113 reaches downwards to grab the cassette C with samples S, after which upwards movement is initiated for moving a desired sample S in front of the sample arm 111. The valve 115 can be closes again.

The sample arm 111 can then collect a sample S, after which the cassette arm 113 moves the cassette C with the remaining samples further upwards, and out of the way of the sample arm 111.

Then, the valve 117 can be opened, and the sample arm 111 moves the sample towards the sample holder H of the microscope M. Once the sample S is transferred to the microscope M, the sample arm 111 can return, and the valve 117 can be closed again. Then, observation or manipulation of the sample can take place.

As indicated, this known Autoloader AL system provides excellent results, especially in terms of sample transfer quality and screening throughput. There exists, however, a desire for improving this system, in particular with respect to sample loading, complexity, ease of installation and maintenance, and associated costs.

To this end, the invention provides a system for handling and storing cryo-charged-particle samples, such as cryo-EM samples. In general, this system comprises a storage apparatus, a charged particle apparatus, and a transfer device that is arranged for transferring cryo-Samples from the storage apparatus to the charged particle apparatus.

Figure 4:
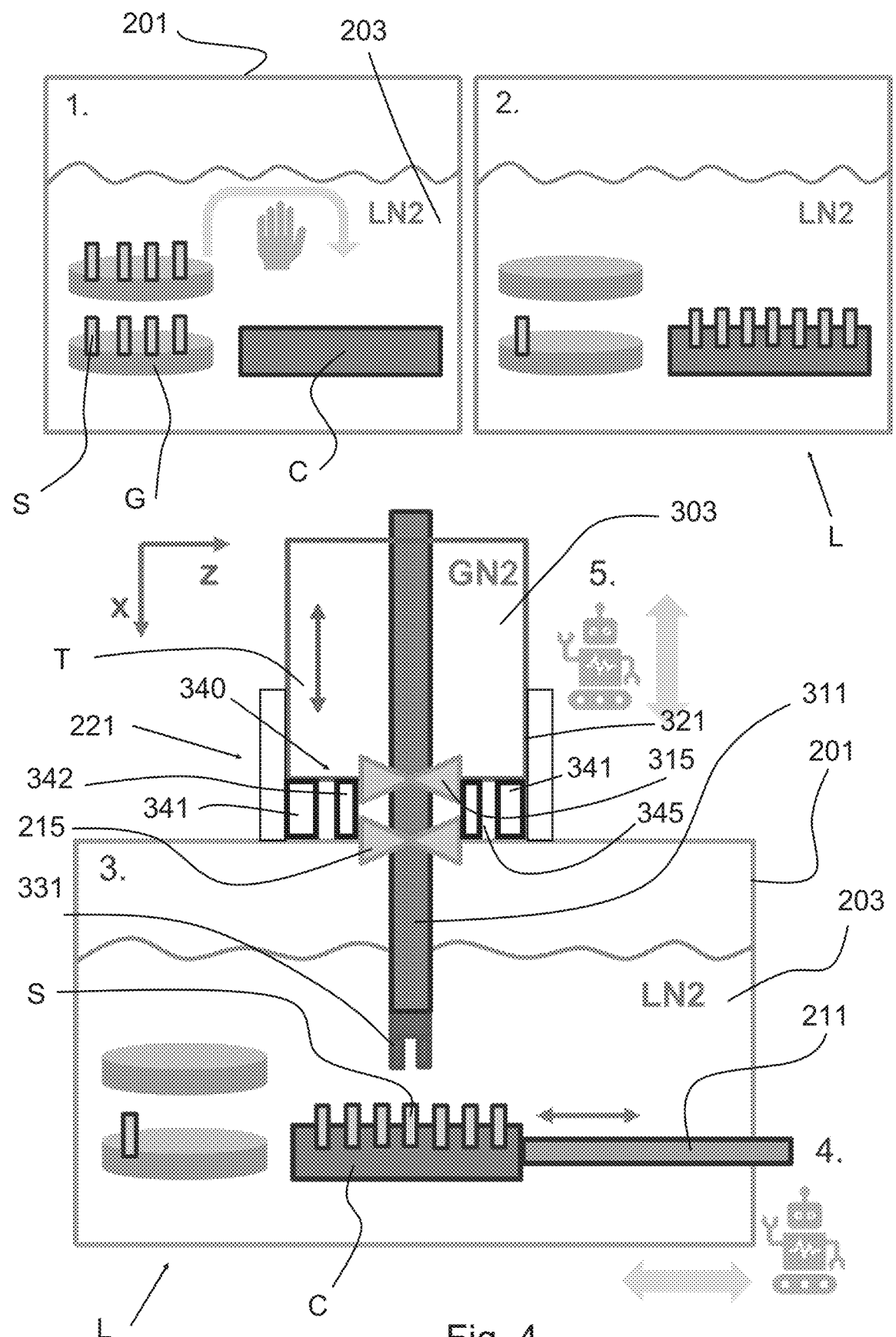
FIG. 4—shows an embodiment of a sample handling and storage method and apparatus as defined herein.

FIG. 4 shows an embodiment of the storage apparatus L. The top row of FIG. 4 shows how samples S are loaded into the storage apparatus L. To this end, samples are provided in gridboxes G. The gridboxes are placed inside a housing 201 of the storage apparatus L, wherein said housing 201 is partly filled with liquid nitrogen 203. A cassette C is provided in the liquid nitrogen 203 as well. The samples are then manually transferred (step 1.) from the gridbox G to the cassette C. Once the samples S are transferred, the cassette C remains (step 2.) inside the housing of the storage apparatus L. The cassette C may be moved, such as for example using cassette arm 211 (see bottom part of FIG. 4), to a separate storage location of the storage apparatus (not shown).

As shown in FIG. 4, the cassette C with samples S is stored inside the housing 201 of the storage apparatus L. In this sense, the housing 201 with liquid nitrogen 203 provides a cryogenic storage room for safely storing the samples inside the storage apparatus.

Once a desired sample is required, the following procedure may be followed. First, a transfer device T as defined herein is provided, and said transfer device T is connected to the storage apparatus S.

The transfer device T comprises an elongated housing 303 that is filled with gaseous nitrogen 303, in which a sample S to be transferred can be temporarily stored at the right temperature. The transfer device T comprises a transfer arm 311 with a gripper 331. The gripper 331 may be used for collecting a sample S. The gripper with the sample S may then be moved inside the housing 303 of the transfer device T.

In the embodiment shown in FIG. 4, the storage apparatus L comprises a valve member 215. The transfer device T also comprises a valve member 315, or transfer port 315. The storage apparatus comprises a first docking member 221 that is arranged to mate with a second docking member 321 of the transfer device T (shown schematically). The storage apparatus may comprise a slot 221, and a housing part 321 of the transfer device may slide into said slot 221 for providing a connected state of the transfer device T and the storage apparatus. This way, a translational docking is provided. Other docking mechanisms or ways of connecting the transfer device T to the storage apparatus L are conceivable as well. It is advantageous in case the docking member 321 of the transfer device T acts as a male connector 321, and the docking member 221 of the storage apparatus L acts as a female connector 221.

As defined herein, and as explained later in more detail, the system comprises at least one suction disc mechanism 340 for securing said connection between said transfer device T and said storage apparatus L. Here, the suction disc mechanism 340 comprises a first sealing ring 341, and a second sealing ring 342, that together with the transfer device T and the storage apparatus L define an annular, ring-shaped suction disc volume 345. It is noted that the second sealing ring 342 encloses said transport port 315 (valve 315), so that the transport port 315 is not part of the suction disc volume 345.

The transfer device T can be connected (or docked) to the storage apparatus L. When the transfer device T is in contact with the storage apparatus, and the suction disc volume 345 is established and closed, the pressure inside the suction disc volume 345 can be reduced. This way, the reduced pressure ensures a suction force between the transfer device T and the apparatus L, so that the connection is temporarily fixed and movement between the transfer device T and the apparatus L is substantially prevented. The suction disc mechanism ensures in this way that connection is easy, safe and secure, without needing complicated latching mechanisms, for example.

Once the transfer device T is connected (or docked) to the storage apparatus L, transfer of the sample S can take place. The valve 315 of the transfer device T is opened, and the valve of the storage apparatus 215 is opened as well. The cassette arm 211 positions the desired sample S in line with the transfer arm 311 of the transfer device T. The transfer arm 311 moves inside the housing 201 of the storage apparatus L, and picks the sample S out of the cassette C, using the gripper 331. The transfer device T is thus arranged for acquiring a sample S out of said cassette C. The gripper 331 with the sample S is then moved to the inside of the housing 303 of the transfer device T. All valves 215, 315 are then closed. The transfer device T can then be disconnected from the storage apparatus L, for movement to the Charged Particle apparatus.

Indicated in FIG. 4, is that the step of positioning the desired sample S, using cassette arm 211, is done mechanically, and in particular automatically, without handling being required by a human operator. The human operator may, through a user interface, select the desired sample, but movement, positioning, collection and transfer are done automatically. This limits the possibility of errors that can occur.

Figure 5:
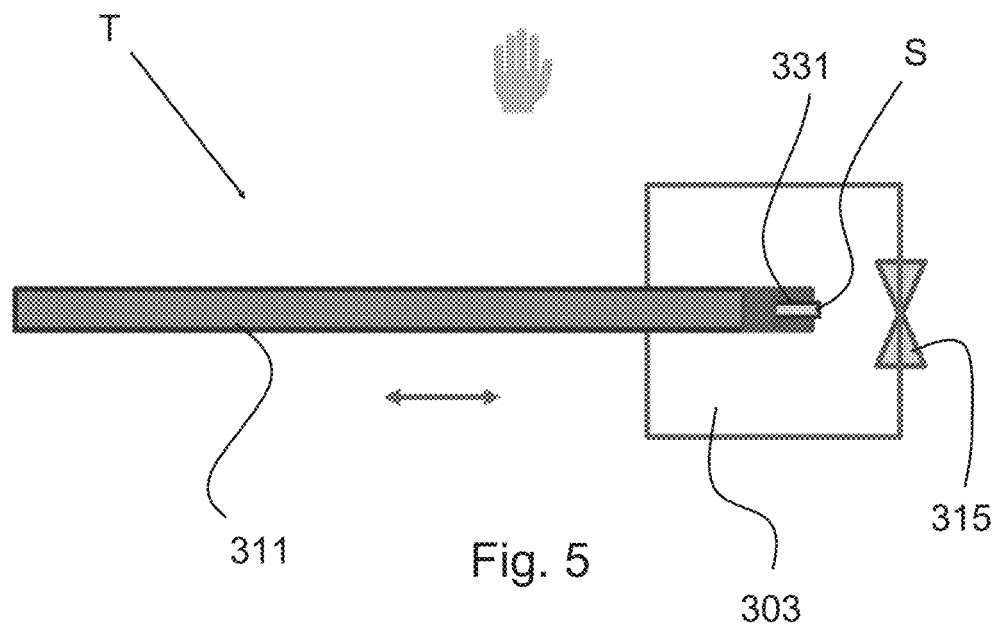
FIG. 5—shows an embodiment of a transfer device for use in a sample handling and storage method and apparatus as defined herein.

FIG. 5 shows the transfer device T in a disconnected state, wherein the sample S is safely seated in gripper 331 of the transfer arm 311. The sample is housed inside housing 303, wherein the housing is filled with gaseous nitrogen to keep the sample at a desired, low, temperature. The heat capacity of the gaseous cold nitrogen inside the housing 303 is such that the transfer device keeps the sample at a desired temperature range for several minutes, such as, for example 15 minutes. Additional cooling means may be provided on, or inside of, the transfer device T to provide active cooling of the sample S inside the housing 331. The transfer device T is transportable by a human operator. The dimensions of the transport device T are chosen such that the average human operator is able to carry the transport device from a first location to a second location, such as for example from the storage apparatus L to the charged particle microscope M. The device may have a length in the order of centimetres, decimetres, or even metres. In a practical embodiment, the device T has a length in between 40 cm to 80 cm, although other dimensions are conceivable as well. The weight of the device T may be in the order of 1 to several kilograms.

Figure 6:
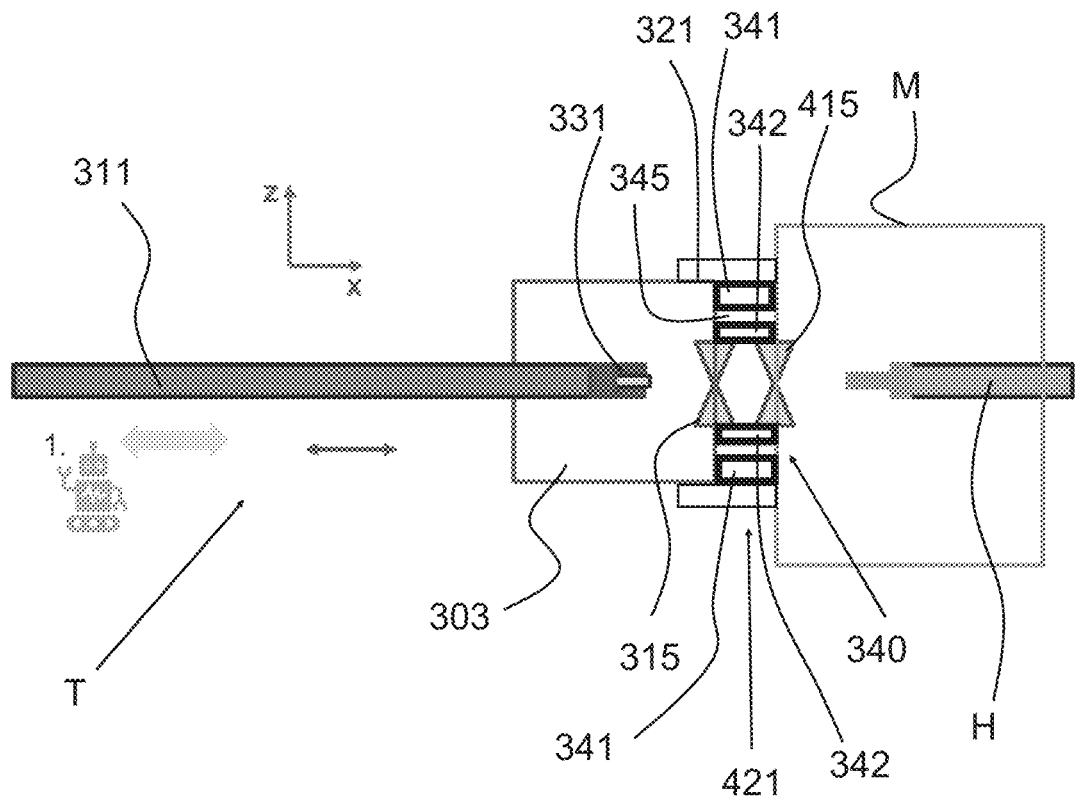
FIG. 6—shows an embodiment of a transfer device and charged particle apparatus for use in a sample handling and storage method and apparatus as defined herein.

FIG. 6 shows the transfer device T being connected to a microscope M. The microscope M is provided with a first docking member 421 that is able to mate with the second docking member 321 of the transport device T. As indicated previously, the docking member 321 of the transport device T may be formed by an external housing part of the transport device T. The microscope M may be provided with a slot 421 that is able to receive the transport device T, or at least the second docking member thereof 321.

As defined herein, and as explained later in more detail, the system comprises at least one suction disc mechanism 340 for securing said connection between said transfer device T and said storage apparatus L. Here, the suction disc mechanism 340 comprises a first sealing ring 341, and a second sealing ring 342, that together with the transfer device T and the storage apparatus L define an annular, ring-shaped suction disc volume 345. It is noted that the second sealing ring 342 encloses said transport port 315 (valve 315), so that the transport port 315 is not part of the suction disc volume 345.

In this embodiment, the suction disc mechanism (and in particular the sealing rings) is (are) mainly provided on the transfer device, so that a single suction disc mechanism in principle is sufficient to establish secure connections with all desired apparatuses. It will be clear, however, that the suction disc mechanism, can be provided on the apparatuses as well, so that the transfer device is free from any suction disc mechanism, and in particular free from any sealing rings. However, the preferred embodiment uses at least one sealing ring on the transfer device. Further details of this suction disc mechanism will be given with respect to FIG. 8.

The transfer device T can be connected (or docked) to the charted particle apparatus CPA. When the transfer device T is in contact with the CPA, and the suction disc volume 345 is established and closed, the pressure inside the suction disc volume 345 can be reduced. This way, the reduced pressure ensures a suction force between the transfer device T and the CPA, so that the connection is temporarily fixed and movement between the transfer device T and the CPA is substantially prevented. The suction disc mechanism ensures in this way that connection is easy, safe and secure, without needing complicated latching mechanisms, for example.

The microscope M has a valve member 415. Once the transport device T is connected and fixed to the microscope M, or charged particle apparatus CPA in general, the valves 315, 415 can be opened, and the transfer arm 311 can move inside the microscope for transferring the sample S to the holder H of the microscope M. With this, the transfer of the sample from a storage location to the charged particle apparatus, such as an electron microscope M, is complete.

The transfer device T can be removed from the microscope M, and transfer of a second sample S2 may occur, whilst the microscope is examining the first sample S.

FIG. 7*a*-7*f* schematically show the sample handling and storage system 500 as defined herein.

Figure 7A:
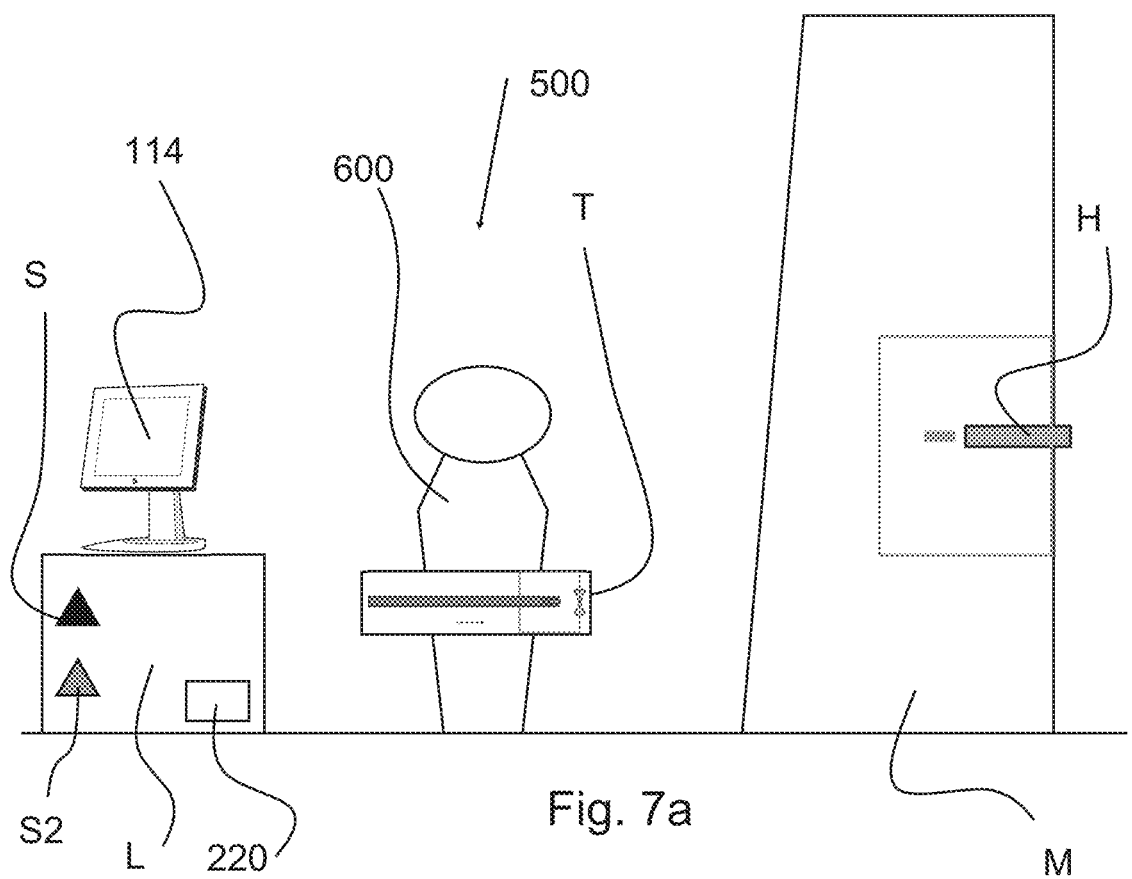
FIG. 7a-7f—shows various stages of a method for transferring a sample in a cryogenic sample handling system as defined herein.

FIG. 7*a* shows that the system 500 comprises a storage apparatus L for storing a plurality of samples S, S2. The storage apparatus L may comprise a user input device 114, in the form of a conventional personal computer having a screen, for example.

The system further comprises a Charged Particle Apparatus (CPA) M, such as a SEM, TEM, STEM and/or FIB. The CPA M is positioned at a location remote from said storage apparatus L. This means, in an embodiment that the CPA M is positioned at a distance of at least 50 cm from the storage apparatus L. For example, the CPA may be positioned at a distance of one to several metres from the storage apparatus. In effect, the distance between the storage apparatus L and the Charged Particle Apparatus M is so large, that a direct transfer from the storage apparatus L to the Apparatus M is not possible, and that an intermediate transfer step is necessary. The advantage of such a system is that it is relatively flexible, as the storage apparatus L and the charged particle apparatus can be positioned at any desirable location, even in different rooms with different environmental conditions.

To ensure safe and reliable sample transfer between the charged particle apparatus CPA and the storage apparatus L is possible, the system 500 comprises a transfer device T. The transfer device T can be handled by a human operator 600. The human operator 600 may carry the transfer device T to and from the storage device, and to and from the charged particle apparatus CPA M.

Figure 7B:
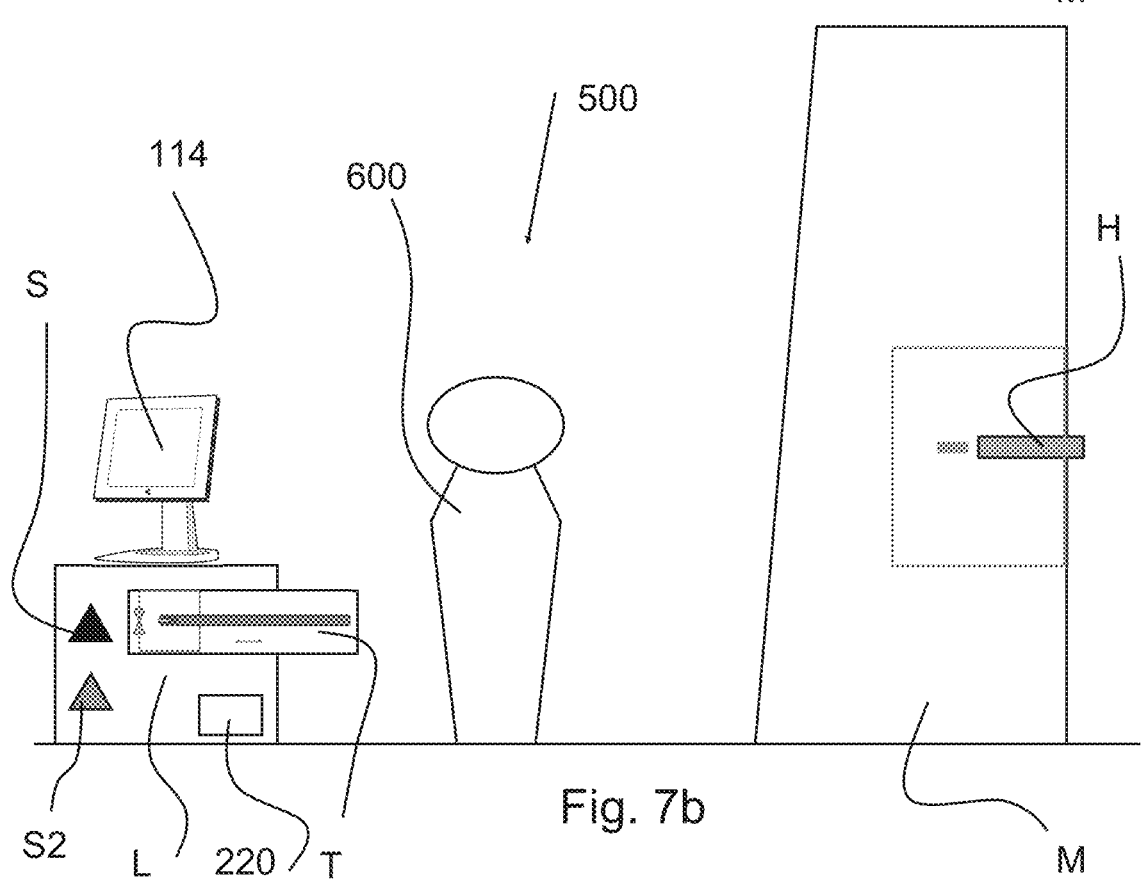
Figure 7C:
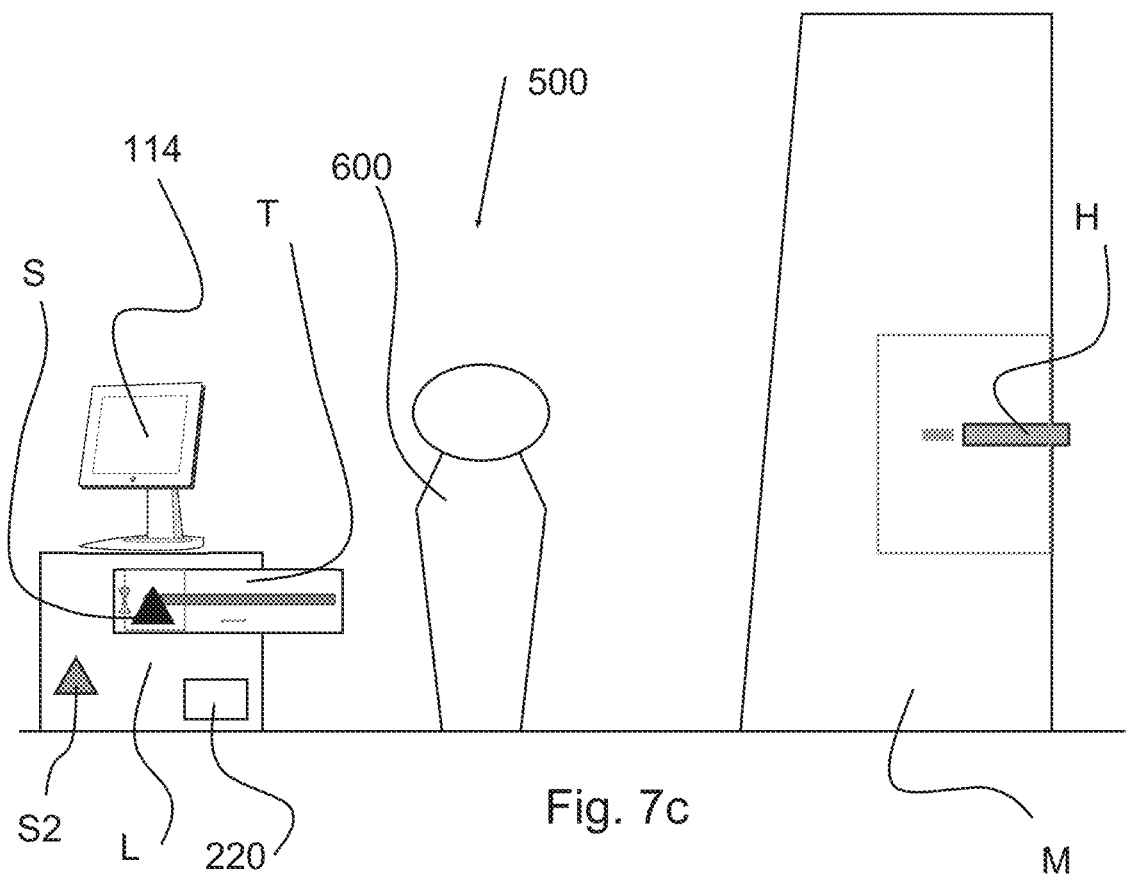
Figure 7D:
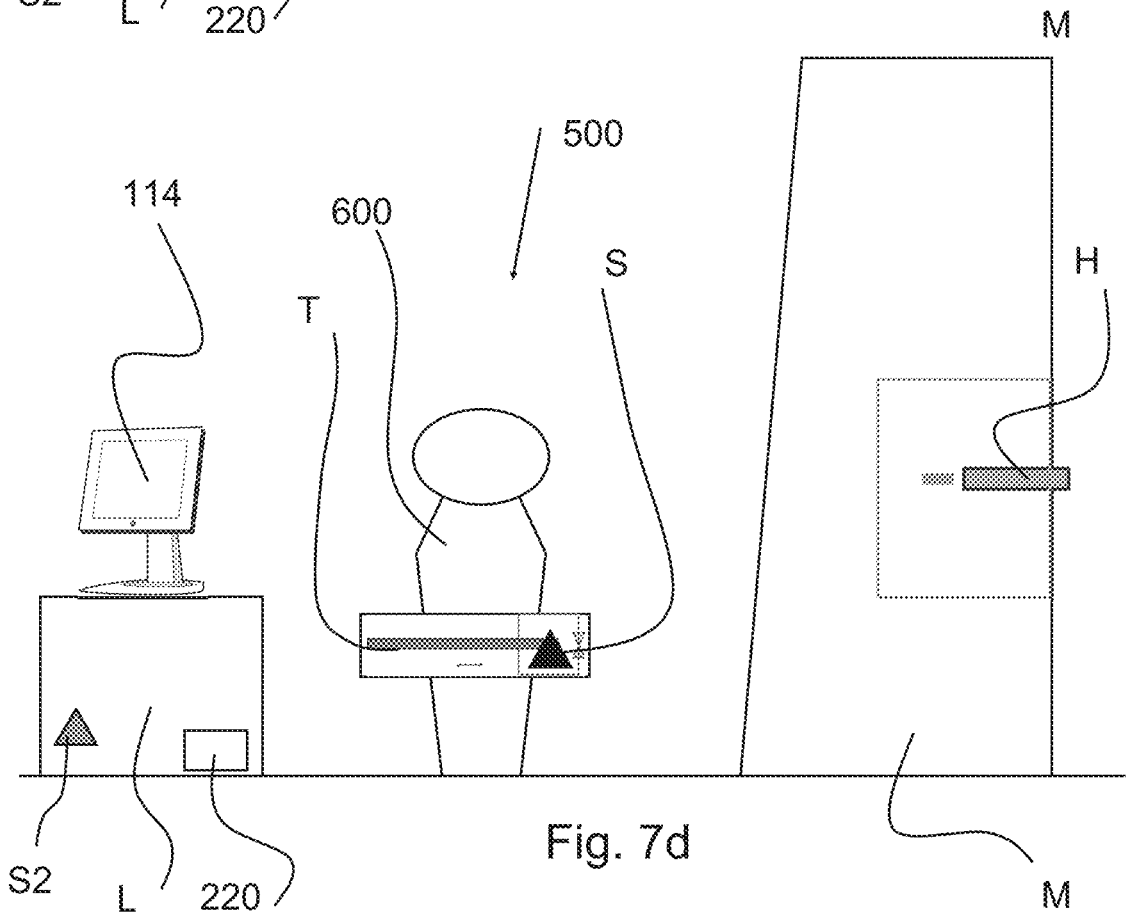

Now turning to FIG. 7b, it is shown that the transfer device T is releasably connectable to said storage apparatus L. As indicated before with respect to FIG. 4, the transfer device is arranged for acquiring a sample S from said plurality of samples S, S2 when connected to said storage apparatus L. In the embodiment shown, the sample is a cryogenic sample. The transfer is effected by connecting the transfer device T to the storage apparatus L, for example by inserting the transfer device T in a slot or recess that is present in the storage apparatus. The connection is then secured by means of a suction disc mechanism (not shown), which suction disc mechanism has already been described under reference to FIGS. 4 and 6, and will be described under reference to FIG. 8 as well. After connecting and securing, the sample transfer as described in FIG. 4 can take place. As shown in FIGS. 7b and 7c, the sample is moved from the storage apparatus L to the transfer device T, in a docked position of the transfer device T with respect to said storage apparatus L. Sample transfer from the storage apparatus L to the transfer device T takes place automatically, in an embodiment, without the need of human operator sample handling.

Once the sample is inside the transfer device T, the human operator may retrieve the transfer device T from the storage apparatus L. The transfer device T with the desired sample S can then be moved to a further location, such as the microscope. The human operator 600 may walk to the further location, wherein the transfer device T is carried by the human operator 600.

Figure 7E:
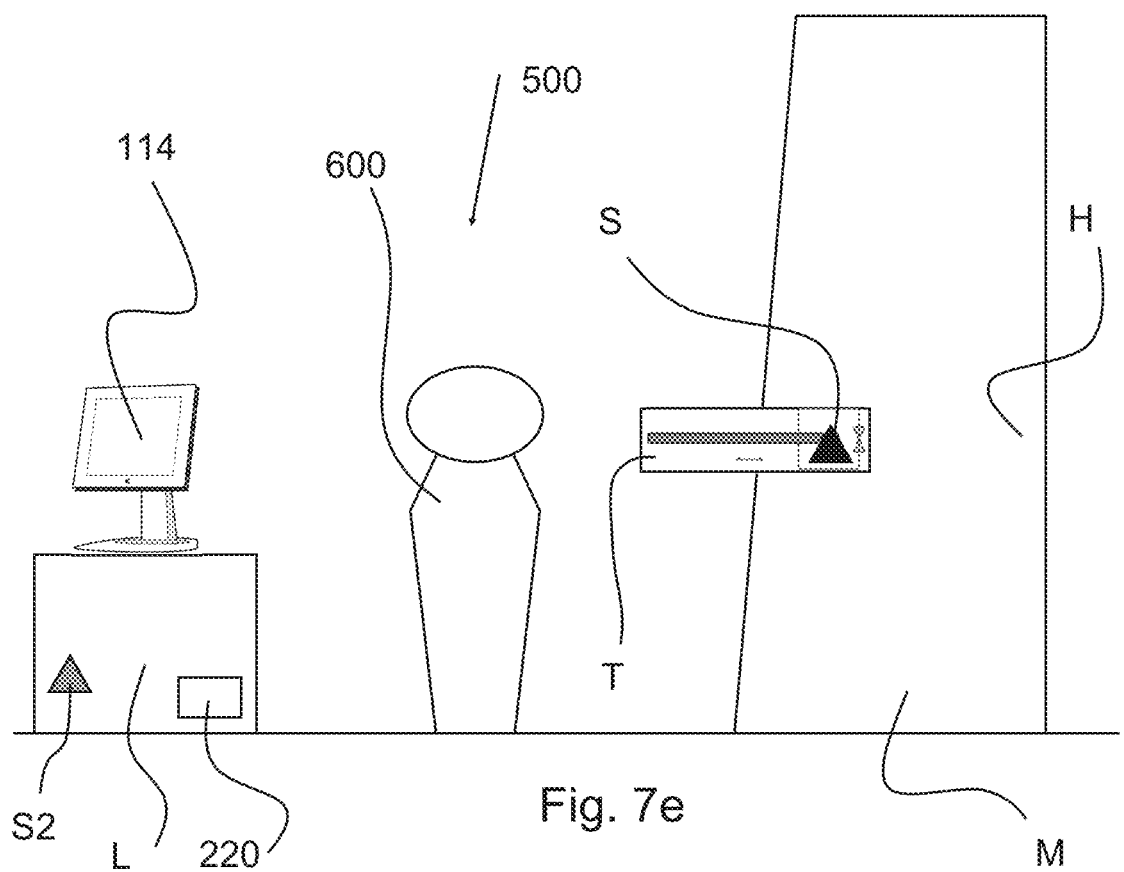
Figure 7F:
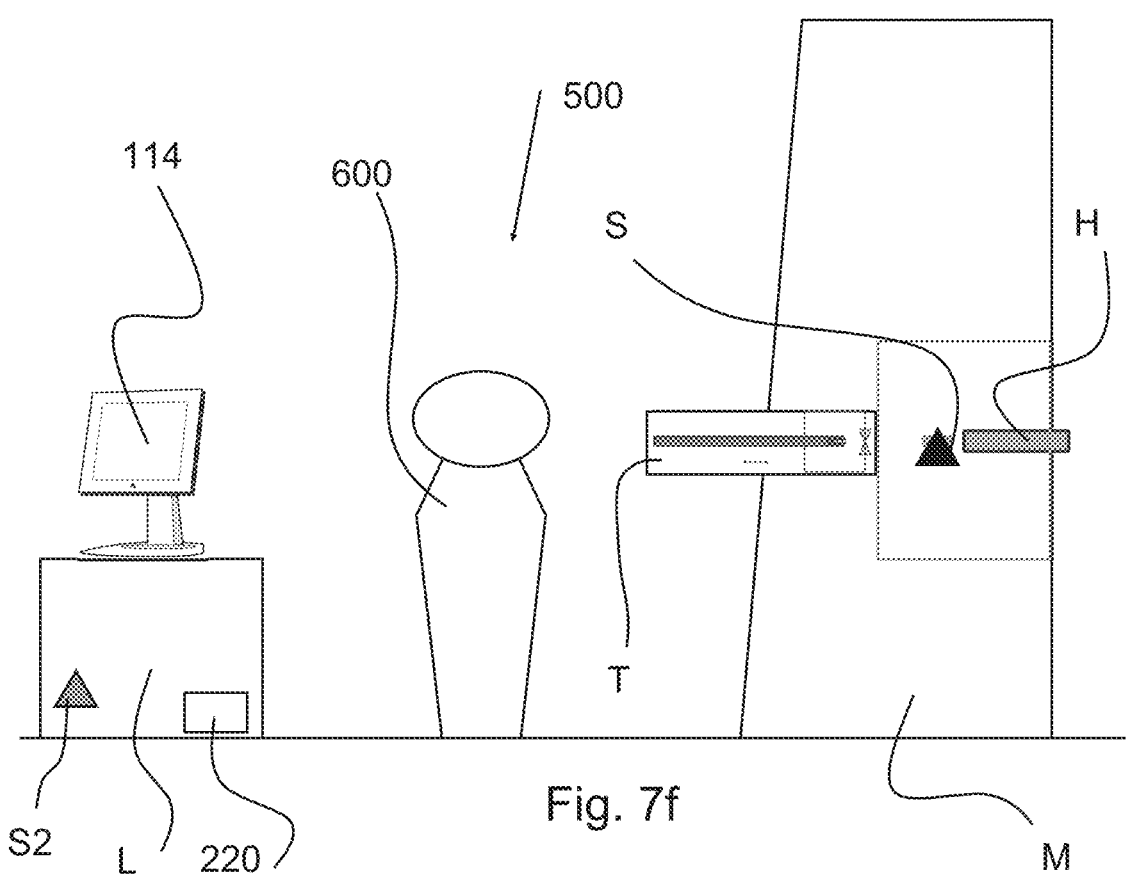

Now turning to FIG. 7e, it is shown that the transfer device T with the sample S is connected to the microscope M (or charged particle apparatus in general). The transfer mechanism of the transfer device T then transfers the sample S from the transfer device T to the sample holder H of the microscope M.

Then, the sample can be observed and/or examined by the microscope M, as described with respect to FIG. 1 and FIG. 2.

As indicated in FIG. 4-7, the transfer device T comprises a transfer mechanism 311, 331 that is arranged for acquiring said sample S (which is a cryogenic sample in the embodiment shown, although other samples can be used as well) from said storage apparatus L when connected to said storage apparatus L, and for delivering said sample to said CPA when connected to said CPA. This way a single mechanism can be used to transfer the sample between two external apparatuses. The apparatuses do not need to have such a mechanism, although they should be arranged to cooperate with the transfer mechanism. Additionally, the apparatuses may comprise additional measures, including mechanical arms 211, valves 215, 415 and the like, for optimizing sample transfer and cooperation with the transfer mechanism 311, 331 of the transfer device.

In an embodiment, the transfer mechanism comprises an movable arm 311. The movable arm may be arranged for translational movement. An outer end of the movable arm 311 may be provided with a gripper 331, wherein said gripper 331 is arranged for gripping and releasing a sample, in particular a sample that comprises a specimen that is provided on a specimen grid. The specimen grid may be connected to other grid elements as well, wherein these grid elements aid in the ease of handling of the sample. The grid elements may comprise, for example, a C-clip ring (i.e. AutoGrid, Thermo Fisher Scientific™) onto which the specimen grid can be mounted, and a C-clip for securing the specimen grid inside the C-clip ring. Other grids are, of course, conceivable as well.

As shown in FIG. 7a-7f, the storage apparatus L comprises an operator input device 114 in the form of a computer, and a control unit 220 that is connected to said operator input device 114 and that is arranged for performing at least some functions of said storage apparatus L, or of said system 500, for example in a connected state of said transfer device T to said storage apparatus L. The operator input device is, in an embodiment, arranged for selecting a sample S, S2 to be transferred, by a human operator 600, from the storage apparatus to the charged particle microscope M. The control unit 220 is arranged for controlling said storage apparatus L and said transfer device T, in a connected state thereof, for transferring said selected sample S from said storage apparatus L to said transfer device T.

The storage apparatus L, including the operator input device 114 may form a first workstation, that enables the human operator to quickly and reliably transfer prepared samples to the storage apparatus L. For example, a top part of the housing 201 of the storage apparatus L may coincide with a desk feature of the workstation. The top part of the housing 201, and/or a desk feature of the workstation, may comprise a lid that is openable and closable by a human operator, such that a gridbox G containing samples S (see FIG. 4, step 1.) can be inserted into the storage apparatus L, and the sample grids S can be transferred to the container C. The lid may also be used for refilling the liquid nitrogen level 203 inside the housing 201. The operator input device and/or the controller may be connected to the housing 201, so that information relating to the housing 201 may be provided to the human operator. For example, the storage apparatus may comprise a number of sensor elements, such as a temperature sensor, a liquid level sensor, or the like, for monitoring a condition of the storage apparatus. The operator input device 114 may provide feedback to the user with respect to one or more of these conditions.

Furthermore, it is conceivable that the operator input device 114 is used for labelling and tracking features. In an embodiment, the operator input device 114 may be wirelessly connected to the Charged Particle Apparatus, so that information regarding the sample S can be transferred to the Charged Particle Apparatus. Information may comprise sample input information, e.g. information that the human operator enters into the operator input device 114 at the time of loading a sample S into a cassette C.

Now turning to FIG. 8, embodiments of the suction disc mechanism as defined herein will be explained in more detail.

Figure 8A:
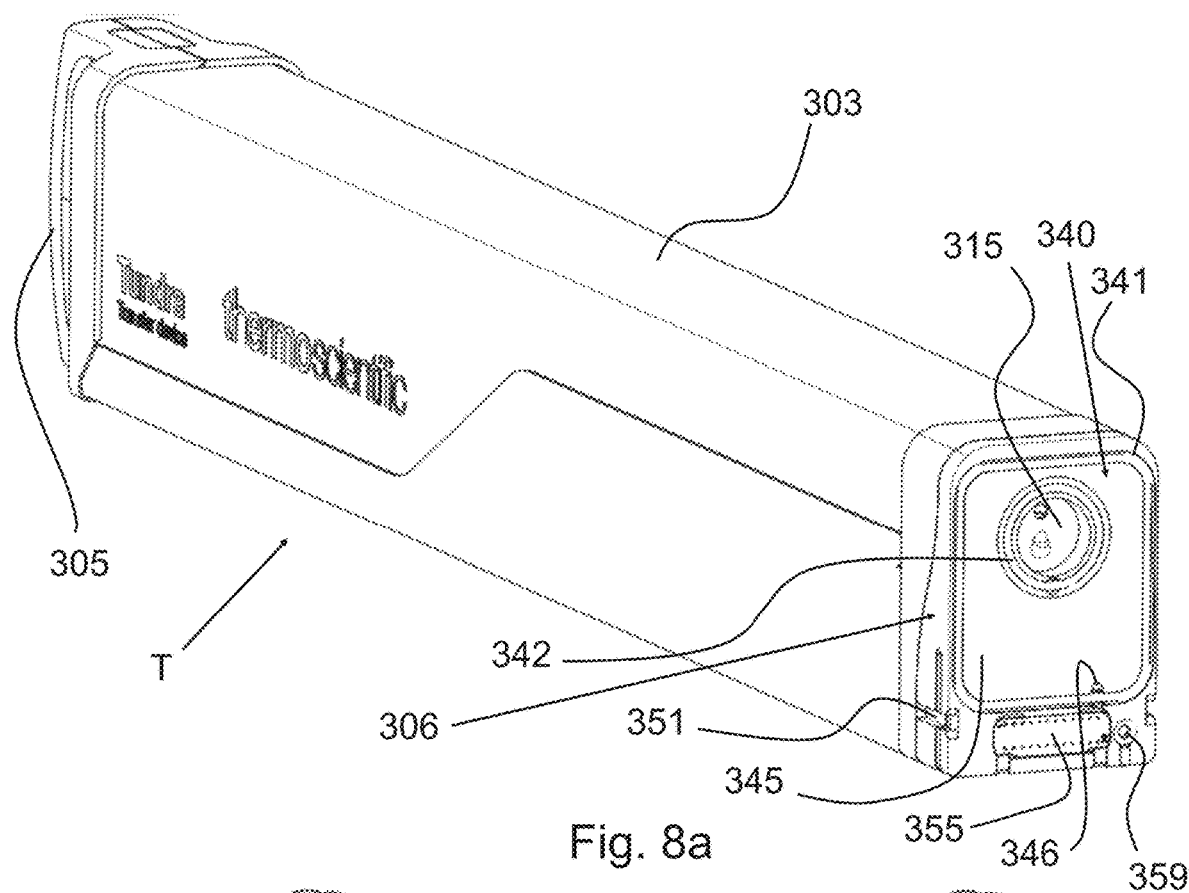
FIG. 8a-8d—shows embodiments of the suction disc mechanism as described herein.

FIG. 8a shows an overview of the transfer device T. The transfer device T comprises an elongated housing 303. On one side of the elongated housing 303 a support handle 305 is provided, that allows easy transfer and operation of the transfer device T by a user. On the opposite side of the elongated housing, the transfer device T comprises a connection face 306. On the connection face 306, a suction disc mechanism 340 is provided. The suction disc mechanism 340 is arranged for securing a connection between said transfer device T and a desired apparatus, such as the storage apparatus L or the CPA M. In the embodiment shown, the suction disc mechanism 340 comprises a first sealing ring 341, and a second sealing ring 342. The first sealing ring 341 is provided along an outer edge of the connection face 306. The second sealing ring 342 is provided near the center part of the connection face 306. The connection face 306 also comprises a transfer port 315, or transfer valve 315. The transfer port 315 is surrounded by the second sealing ring 342. As can be seen in FIG. 8a, the suction disc volume 345 is ring-shaped or donut-shaped, with the transfer valve 315 provided in the "hole" of the ring/donut. This way the transfer port 315 does not form part of the suction disc volume 345, but is enclosed by the suction disc volume. In an alternative embodiment (not shown) it is conceivable that the transfer port 315 is not enclosed by the suction disc volume 340, but that the suction disc volume is provided at a distance from said transfer port 315. However, by enclosing the transfer port 315 by the suction disc volume, a safe and reliable connection between the transfer device T and the desired apparatus L, M is established, and furthermore the risk of contamination of the sample during transfer is reduced.

To establish the connection between the transfer device T and the desired apparatus L, M, the suction disc mechanism 340 may be operated. To this end, the connection face 306 is brought into contact with the desired apparatus, and excess air is removed from the suction disc volume 345. The transfer device T comprises an air exhaust 346 that can be used to remove excess air.

As can be seen in FIG. 8a, the transfer device T comprises electrical contact elements 355. These electrical contact elements 355 are arranged for connecting to further electrical contact elements 355 provided on the desired apparatus L, M. The electrical connection provided by the electrical contact elements 355 allows information to be exchanged between the connected device and the desired apparatus, but also allows operation of parts of the transfer device, wherein said operation is initiated by the desired apparatus, for example. The information can be related to the sample type, the temperature, the sample storage condition, but may also include information regarding a successful connection, for example.

The transfer device T further comprises an interface opening 359, which may be used to operate the transfer mechanism that, in certain embodiments, is situated inside of the transfer device. In an embodiment, the interface opening 359 allows compressed air to pass from the desired apparatus L, M to the transfer device (or vice versa) for operating the transfer mechanism 311, 331.

Once the transfer device T is connected (or docked) to the desired apparatus L, M, and the suction disc mechanism 340 is operated, it will be possible to transfer the sample S from the transfer device T to the desired apparatus L, M (or vice versa). As can be seen in more detail in FIG. 8b, the transfer device comprises a latching mechanism 351 to open valve 315. The latching mechanism 351 basically comprises a sliding door mechanism. The latching mechanism 351 comprises a recess in the sliding door, that can be operated by a hook element 461 that is part of the desired apparatus L, M. This way, unintentional and undesired opening of the valve is prevented, and can only be done in a truly connected state of the transfer device.

Figure 8B:
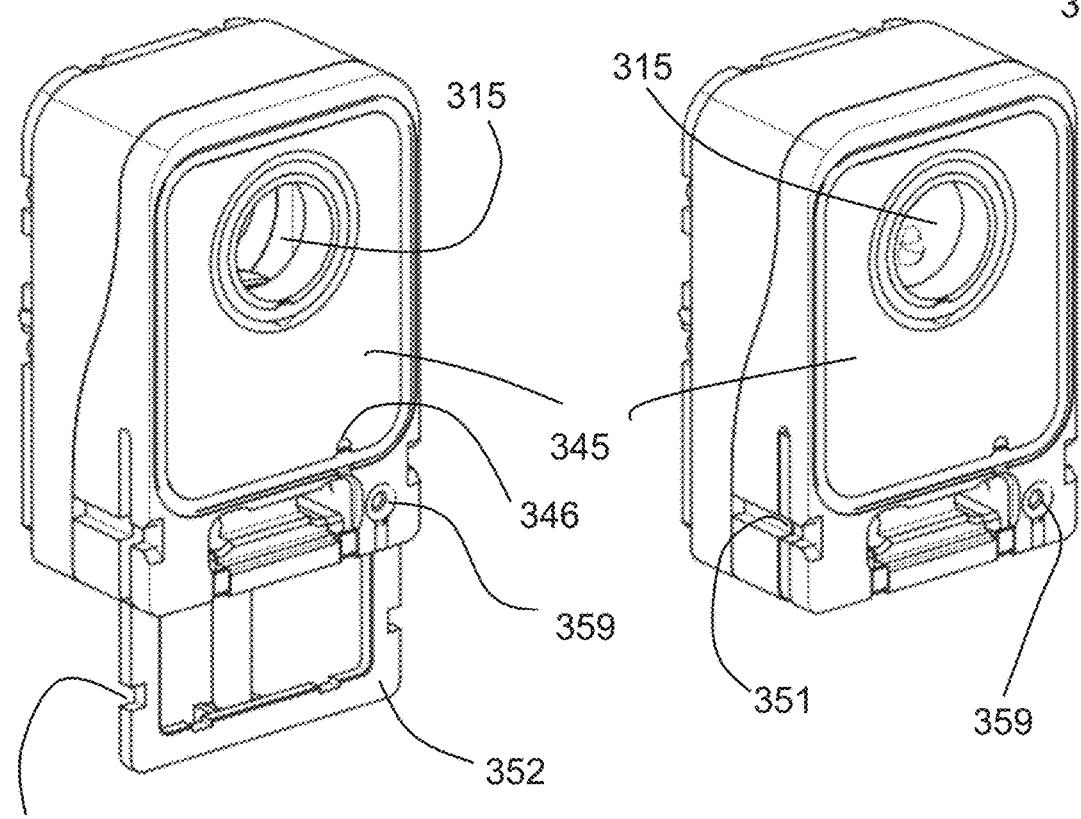
Figure 8C:
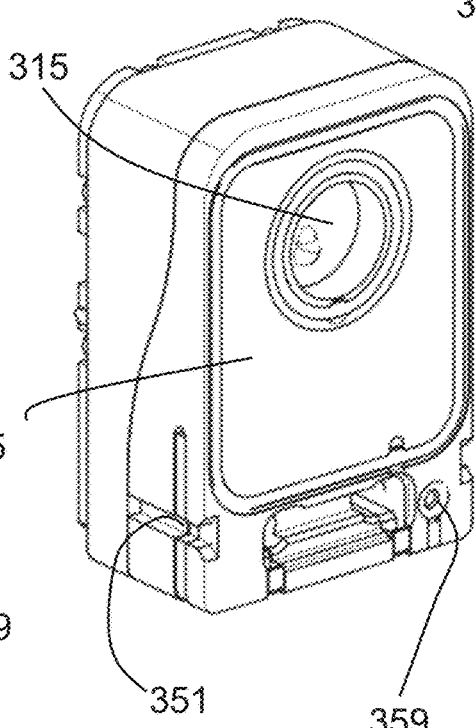
Figure 8D:
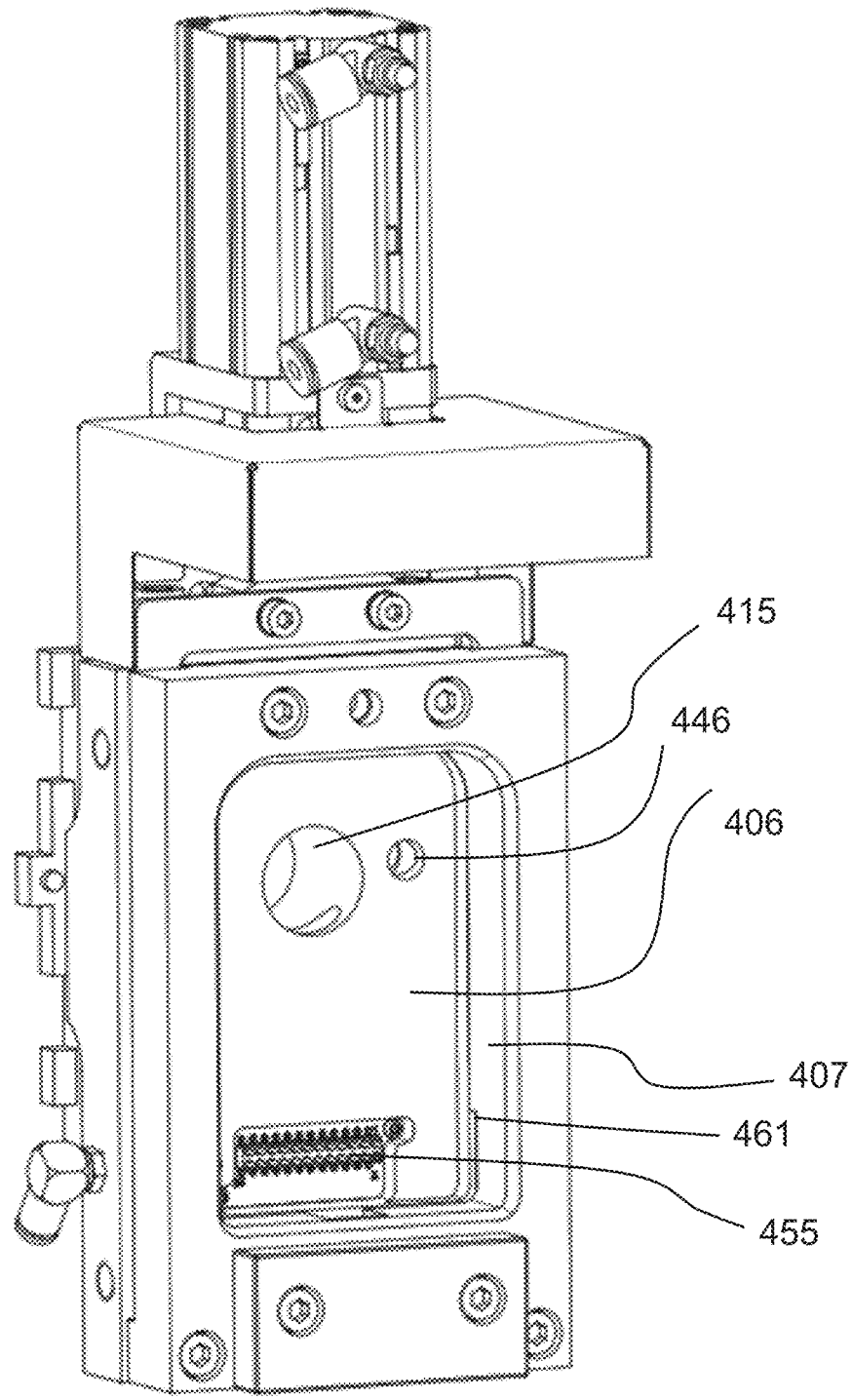

FIG. 8d shows an embodiment of the docking member 421 of the desired apparatus, which in the embodiment shown is for a microscope, but could also be implemented for the storage apparatus L, wherein the desired apparatus L, M is arranged to be connectable to the transfer device T according to the embodiment as shown in FIG. 8a-8c. Here, the first docking member 421 is able to mate with the second docking member 321 of the transport device T as shown in FIG. 8a-8c. The docking member 421 comprises a slot or recess, having a bottom wall 406 and side walls 407. Electrical contact elements 455 are provided that are able to connect to the electrical contact elements 355 of the transfer device T. When connecting the transfer device T to the docking member 421, the sealing rings 341, 342, the connection face and the bottom wall 406 of the desired apparatus L, M define a suction disc volume 345. Excess air may be removed from this suction disc volume 345 by exhaust 346 of the transfer device and/or exhaust 446 of the desired apparatus L, M, to secure the connection between the transfer device T and the desired apparatus L, M. Then transfer may be initiated by opening the respective valves 315, 415, wherein use can be made of the hook 461 to open the latching mechanism 351 of the transfer device T.

Above, the system has been discussed in more detail using exemplary embodiments. The desired protection is conferred by the appended claims.

The invention claimed is:

1. A sample handling and storage system, comprising:
a storage apparatus for storing a plurality of samples;
a Charged Particle Apparatus (CPA) at a location remote from said storage apparatus; and
a transfer device that is releasably connectable to said storage apparatus and said CPA, wherein said system is arranged for transferring a sample from said storage apparatus to said transferring device when said transfer device is connected to said storage apparatus, and arranged for transferring said sample from said transfer device to said CPA when connected to said CPA;
wherein the system comprises at least one suction disc mechanism for securing said connection between said transfer device and at least one of said storage apparatus and said CPA.

2. The sample handling and storage system of claim 1, wherein said transfer device comprises an elongated housing, and each of said storage apparatus and said CPA comprises a corresponding recess for receiving said elongated housing.

3. The sample handling and storage system of claim 2, wherein side walls of said recess provide a guiding surface for said housing of said transfer device, and a bottom wall of said recess provides an abutting surface for said housing.

4. The sample handling and storage system of claim 3, wherein said elongated housing comprises a connection face that, in a connected state, is directed to said bottom wall of said recess.

5. The sample handling and storage system of claim 1, wherein said suction disc mechanism is provided on said transfer device.

6. The sample handling and storage system of claim 5, wherein said suction disc mechanism is provided on said connection face of said transfer device.

7. The sample handling and storage system of claim 5, wherein said transfer device comprises a transfer port provided in said connection face, and said bottom wall of said recess comprises a transfer opening.

8. The sample handling and storage system of claim 7, wherein said suction disc mechanism encloses said transfer port.

9. The sample handling and storage system of claim 1, wherein said transfer device and at least one of said storage apparatus and said CPA are provided with electrical contact elements, wherein said electrical contact elements are arranged to be in contact with each other in a connected state of said transfer device to said at least one of said storage apparatus and said CPA.

10. The sample handling and storage system of claim 1, wherein the transfer device comprises a transfer mechanism that is arranged for acquiring said sample from said storage apparatus when connected to said storage apparatus, and for delivering said sample to said CPA when connected to said CPA.

11. A transfer device for transferring a sample for use in a sample handling and storage system according to claim 1, wherein said transfer device is releasably connectable to a storage apparatus for storing a plurality of samples, wherein in a connected state of said transfer device to said storage apparatus a sample is transferrable from said storage apparatus to said transfer derive, and wherein said transfer device is furthermore releasably connectable to a Charged Particle Apparatus (CPA), wherein in a connected state of said transfer device to said CPA said sample is transferrable to said CPA, characterized in that said transfer device comprises at least one suction disc mechanism for securing said connection between said transfer device and said sample handling and storage system and said CPA.

12. The transfer device of claim 11, wherein said transfer device comprises an elongated housing having at least one connection face.

13. The transfer device of claim 12, wherein said suction disc mechanism is provided on said transfer device.

14. The transfer device of claim 12, wherein said transfer device comprises a transfer port provided in said connection face.

15. The transfer device of claims 13, wherein said suction disc mechanism encloses said transfer port.

16. The sample handling and storage system of claim 1, wherein a suction disc mechanism of the at least one suction disc mechanism comprises a first sealing ring and a second sealing ring that define, at least in part, a suction disc volume.

17. The sample handling and storage system of claim 16, wherein the second sealing ring surrounds the transfer port and excludes the transfer port from the suction disc volume.

18. The sample handling and storage system of claim 16, wherein the first sealing ring is provided along an outer edge of a connection face of the transfer device.

19. The sample handling and storage system of claim 1, further comprising an interface opening, operably coupled with the transfer mechanism.

20. The sample handling and storage system of claim 19, wherein the interface opening allows compressed air to pass from the CPA to the transfer device.

* * * * *